(12) United States Patent
Todd

(10) Patent No.: US 6,885,223 B2
(45) Date of Patent: Apr. 26, 2005

(54) OVERVOLTAGE DETECTOR

(75) Inventor: Ronald C. Todd, Amissville, VA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 10/434,098

(22) Filed: May 9, 2003

(65) Prior Publication Data

US 2004/0222823 A1 Nov. 11, 2004

(51) Int. Cl.[7] .......................... H03K 5/153; H02H 3/20; H02H 9/04
(52) U.S. Cl. ......................................... 327/72; 361/91.1
(58) Field of Search .................................. 327/534, 535, 327/537, 72, 77–82, 427, 432, 434, 437, 540–541, 543, 545–546; 361/90, 91.1

(56) References Cited

U.S. PATENT DOCUMENTS

| | | | |
|---|---|---|---|
| 5,182,529 A | * | 1/1993 | Chern .......................... 331/57 |
| 5,635,860 A | * | 6/1997 | Westerwick .................. 326/81 |
| 5,933,027 A | * | 8/1999 | Morris et al. ................. 326/81 |
| 6,127,879 A | | 10/2000 | Willis et al. ................. 327/408 |
| 6,208,178 B1 | * | 3/2001 | Chen ........................... 327/108 |
| 6,239,961 B1 | | 5/2001 | Maroon ......................... 361/86 |
| 6,252,256 B1 | | 6/2001 | Ugge et al. .................. 257/111 |
| 6,271,703 B1 | | 8/2001 | Wert ........................... 327/309 |
| 6,288,881 B1 | | 9/2001 | Melvin et al. ................. 361/18 |
| 6,344,958 B1 | | 2/2002 | Morrill ....................... 361/91.5 |
| 6,404,275 B1 | * | 6/2002 | Voldman et al. ............ 327/538 |
| 6,455,895 B1 | | 9/2002 | Morishita .................... 257/355 |
| 6,496,054 B1 | * | 12/2002 | Prather et al. .............. 327/534 |
| 6,538,866 B1 | | 3/2003 | Hanzawa et al. ........... 361/91.1 |

* cited by examiner

*Primary Examiner*—My-Trang Nu Ton
(74) *Attorney, Agent, or Firm*—Swidler Berlin LLP

(57) ABSTRACT

An overvoltage circuit detects differences between the supply voltage from a first circuit and the operating voltage of a second circuit. The circuit may detect when the power supply value of the first circuit is below, above, or equal to the operating voltage of the second circuit. The overvoltage circuit consumes substantially zero static current and may be used in a variety of implementations.

14 Claims, 4 Drawing Sheets

OVERVOLTAGE DETECTOR

BACKGROUND OF THE INVENTION

1. Field of the Invention

The present invention relates to the field of integrated circuits. More specifically, the present invention relates to a circuit for determining if the operating voltage of a first circuit exceeds the power supply value of a second circuit.

2. Background of the Invention

The integrated circuit business and semiconductor industry continually strive to reduce the cost and power of its products while improving their performance. Integrated circuit products include, for example, microprocessors, memories, programmable logic, and programmable controllers. Price reduction is achieved through scaled processes that reduce size and increase yields. Power reduction has been accomplished through, for example, circuit design techniques, power management schemes, and parasitic scaling.

Semiconductor integrated circuit technology is developing rapidly. One consequence of the rapid development is that modern integrated circuit devices are being designed to operate from system supply voltages that are constantly becoming lower. For example, many older electrical circuits were designed to operate from a 5 Volt supply. However, newer devices are designed to operate from voltages such as 3.3 Volts or lower.

Despite this trend, all manufacturers have not switched over to the lower power supply simultaneously. Therefore, integrated circuits must still supply higher operating voltages so that older electrical circuits can operate efficiently. Mixed voltage circuits require "overvoltage" tolerant interfaces that allow devices operating from a lower supply voltage to interface with other devices operating at a higher supply voltage.

Many newer circuits may not be tolerant of signals provided by older circuits. At the very least, signal integrity can be compromised. In a worst case scenario, circuit damage and system malfunction can occur unless the incompatible operation is prevented or controlled. In order to facilitate compatible operation between newer and older circuits, a circuit must first detect differences between the supply voltage and the operating voltage of a given circuit. Compensation circuits can then be designed to accommodate for these differences.

A continuing need exists for a simple overvoltage detection circuit that can be adapted for use in a variety of applications.

SUMMARY OF THE INVENTION

In a preferred embodiment, the present invention comprises a device for comparing an operating voltage with a supply voltage. The device comprises a first transistor operatively connected to receive the operating voltage and the supply voltage. A second transistor may be operatively connected to the first transistor and to receive the supply voltage. A third transistor may be operatively connected to the first and second transistors, and to ground. A fourth transistor, operatively connected to the first, second, and third transistors, may also be connected to ground.

In an alternate embodiment, the present invention may include a biasing circuit. The biasing circuit may include a fifth transistor operatively connected to the second transistor. In addition, the fifth transistor may be operatively connected to receive the operating voltage and the supply voltage. A sixth transistor may be also be operatively connected to the second and fifth transistor. The sixth transistor may receive the operating voltage and the supply voltage.

In another embodiment, the device can include a seventh and eighth transistor. The seventh transistor may be operatively connected to the first, third, and fourth transistors. Optionally, the seventh transistor may be operatively connected to receive the operating voltage. In the embodiment, the eighth transistor may be operatively connected to the first, second, third, and fourth transistor. Optionally, the eighth transistor may also be operatively connected to receive the operating voltage and the supply voltage.

In each embodiment according to the present invention, the operatively connected transistors use substantially zero static current. In some embodiments, each of the transistors may comprise at least one of n-channel or p-channel field effect transistors. In alternate embodiments, the transistors may have a substantially low threshold voltage.

Other embodiments of the invention embodying the same or equivalent principles may be used and structural changes may be made as desired by those skilled in art without departing from the present invention and the purview of the appended claims.

The details of the present invention, both as to its structure and operation can best be understood by referring to the accompanying drawings.

DETAILED DESCRIPTION OF THE DRAWINGS

In a preferred embodiment, the present invention comprises a device for comparing an operating voltage with a supply voltage. The device comprises a first transistor operatively connected to receive the operating voltage and the supply voltage. A second transistor may be operatively connected to the first transistor and to receive the supply voltage. A third transistor may be operatively connected to the first and second transistors, and to ground. A fourth transistor, operatively connected to the first, second, and third transistors, may also be connected to ground.

Figure 1:
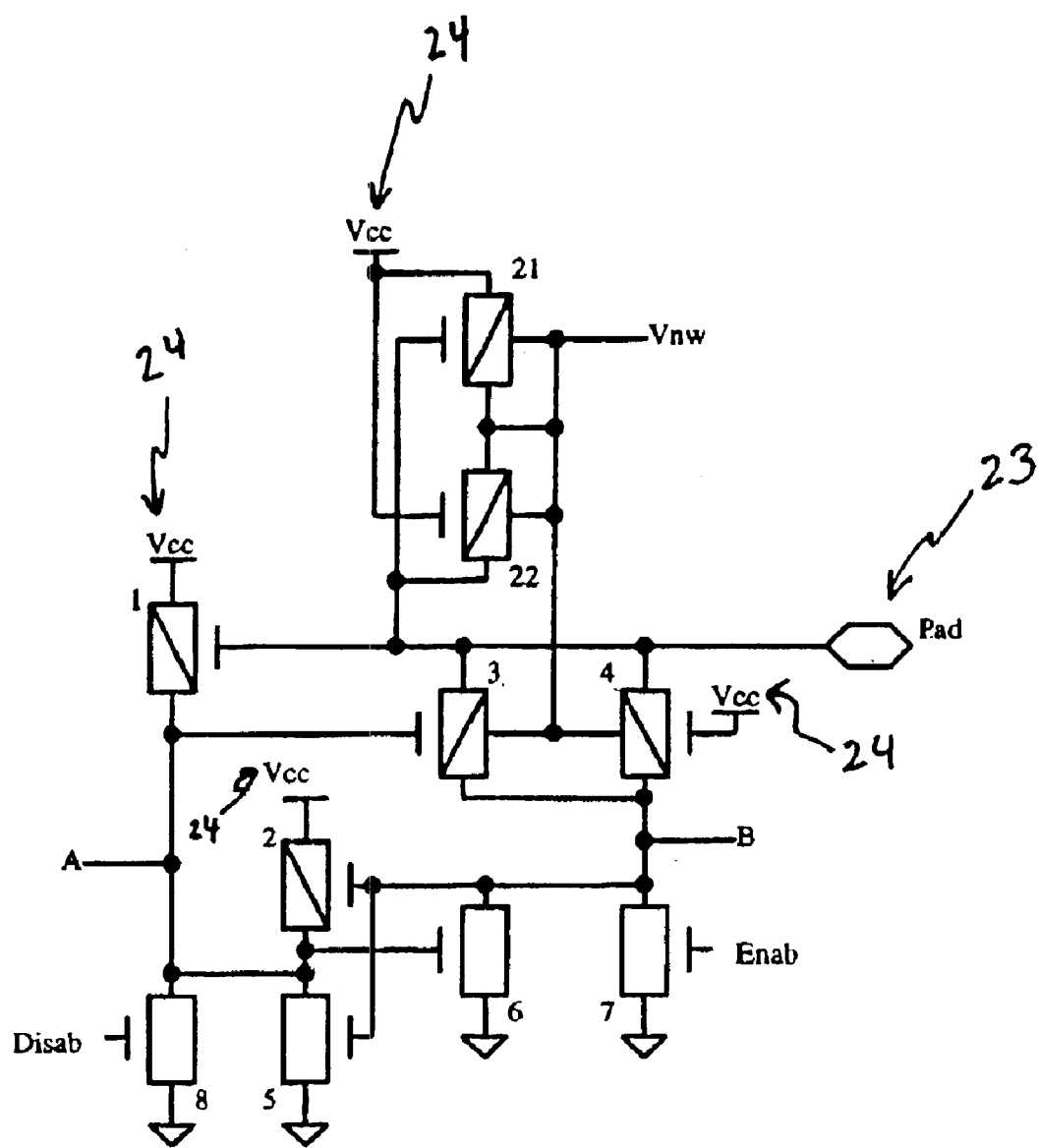
FIG. 1 is a circuit diagram showing an exemplary embodiment of an overvoltage detection circuit.

FIG. 1 shows an exemplary embodiment of an overvoltage detector circuit. The exemplary circuit is capable of determining the relationship between the operating voltage of an external circuit and the operating voltage of a circuit power supply. In one embodiment of the present invention, the exemplary circuit can be used to allow low voltage CMOS integrated circuits (IC) to interface with high voltage circuits within a common system. This is achieved by detecting when an external circuit supplying a voltage exceeds the value of the circuit power supply. The exemplary embodiment can be used for many applications and is not intended to be limited to CMOS integrated circuits.

The exemplary embodiment of the present invention operates by comparing the circuit power supply Vcc 24 with the pad 23 voltage. The voltage level at nodes A and B are then changed according to this comparison. In the exemplary embodiment, the voltage levels at node A and B comprise voltages that correspond to logic levels 1 and 0. References to logic level are understood to be the positive logic case. In other words, logic level 0 is substantially equal to the negative supply of the circuit, while logic level 1 is understood to be a voltage substantially positive in relation to the negative supply of the circuit. However, this is not intended to limit the present invention and can be reversed or modified according to the objectives of a given application.

Figure 2:
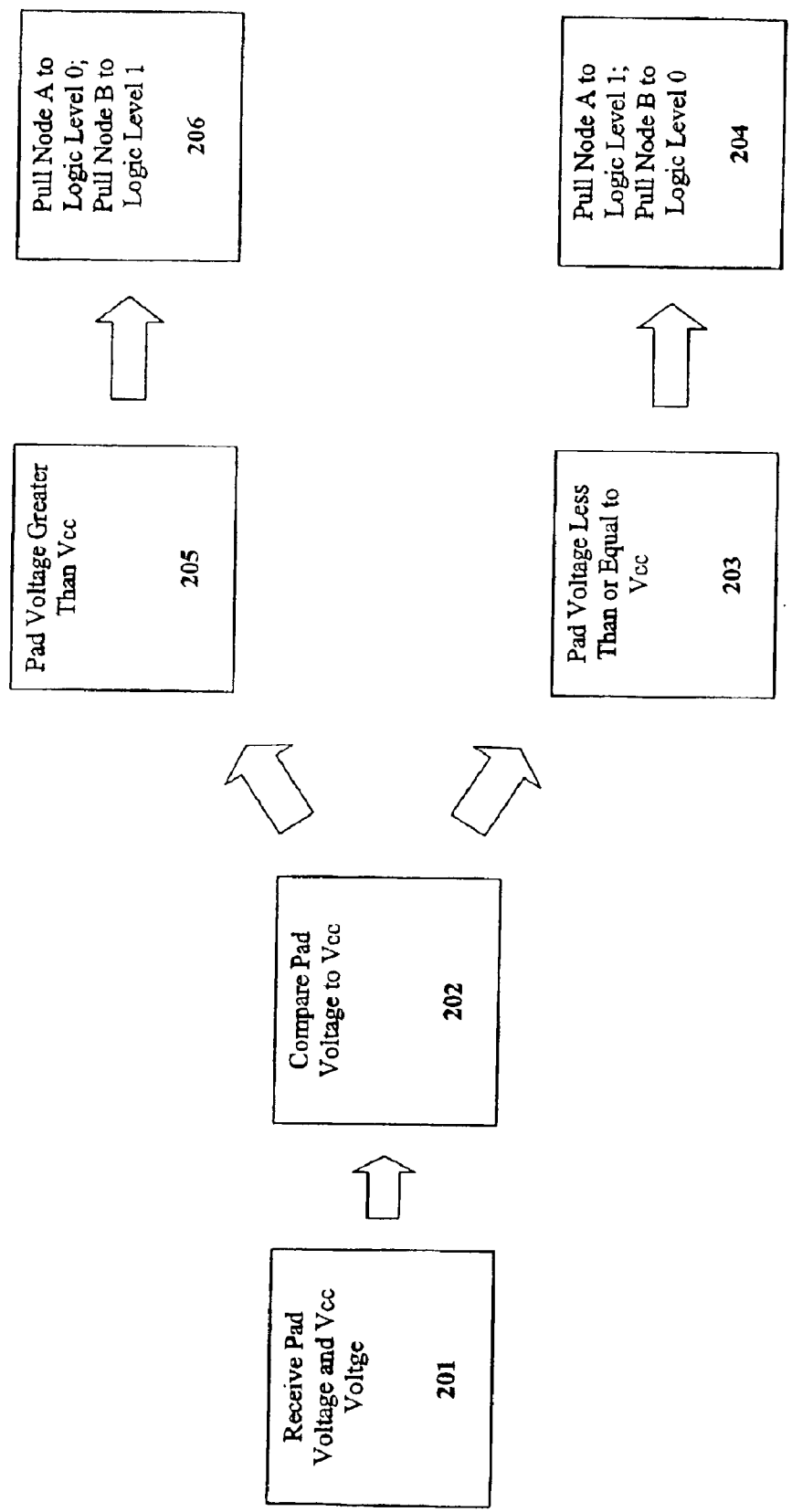
FIG. 2 is a flow chart showing an overview of the operation of the overvoltage detection circuit shown in FIG. 1.

FIG. 2 is a flow chart showing an overview of the operation of the exemplary overvoltage detection circuit shown in FIG. 1. The overvoltage detection circuit first receives a voltage from the pad 23. The circuit shown in FIG. 1 uses a plurality of switches to compare the pad 23 voltage with the operating voltage of the circuit, Vcc 24. After comparing the two voltages (23 and 24), the circuit performs one of two operations. If the voltage at the pad 23 is less than or equal to the circuit power supply voltage Vcc 24, node A is driven to logic level 1. If the circuit detects that the pad 23 voltage is greater than or equal to the circuit power supply voltage 24, node A is driven to logic level 0. When node A is at logic level 1, the circuit is said to be in a "normal" mode of operation. When node A is at logic level 0, the circuit is said to be in an "overvoltage" mode of operation. This is just one example, and is not intended to limit the present invention.

In the exemplary embodiment, switches 1–8, and 21–22 (FIG. 1) function to change the voltage level of nodes A and B, depending on the detected pad 23 voltage. In the exemplary embodiment, each switch comprises a Field Effect Transistor (FET). However, any other switching device or amplifier including, for example, bipolar junction transistors, may be used. In the exemplary embodiment, two types of field effect transistors are used. The first type comprises a p-channel FET, represented by switches 1–4, and 21–22. The second type of FET is an n-channel FET, represented by switches 5–8. P-channel and n-channel FET's are chosen according to a particular application by those skilled in the art. Each switch, 1–8, and 21–22, shown in the exemplary embodiment comprises one or more components, as determined by those skilled in the art. Any number or types of switching devices can be used to determine the voltage of the pad 23 relative to the operating voltage of the circuit. For example, to reduce cost or complexity, fewer switches can be used to implement the circuit described with respect to FIG. 1. Alternatively, more switches can be employed to assist in changing the voltages of nodes A and B, depending on the objectives of a particular application.

Node B, shown in the exemplary embodiment (FIG. 1), is essentially the complement of node A. Accordingly, node B is driven to logic level 0 when the voltage at pad 23 of the circuit is less than or equal to the power supply voltage 24. Node B is driven to logic level 1 when the circuit detects that the pad 23 voltage is greater than or equal to the circuit power supply voltage 24. Once the process of detection produces a result at nodes A and B indicating which of two voltage levels the pad power supply is connected to, other circuitry or software may take advantage of the changing logic levels of nodes A and B. This circuitry or software may be designed according to a particular application by those skilled in the art.

Figure 3:
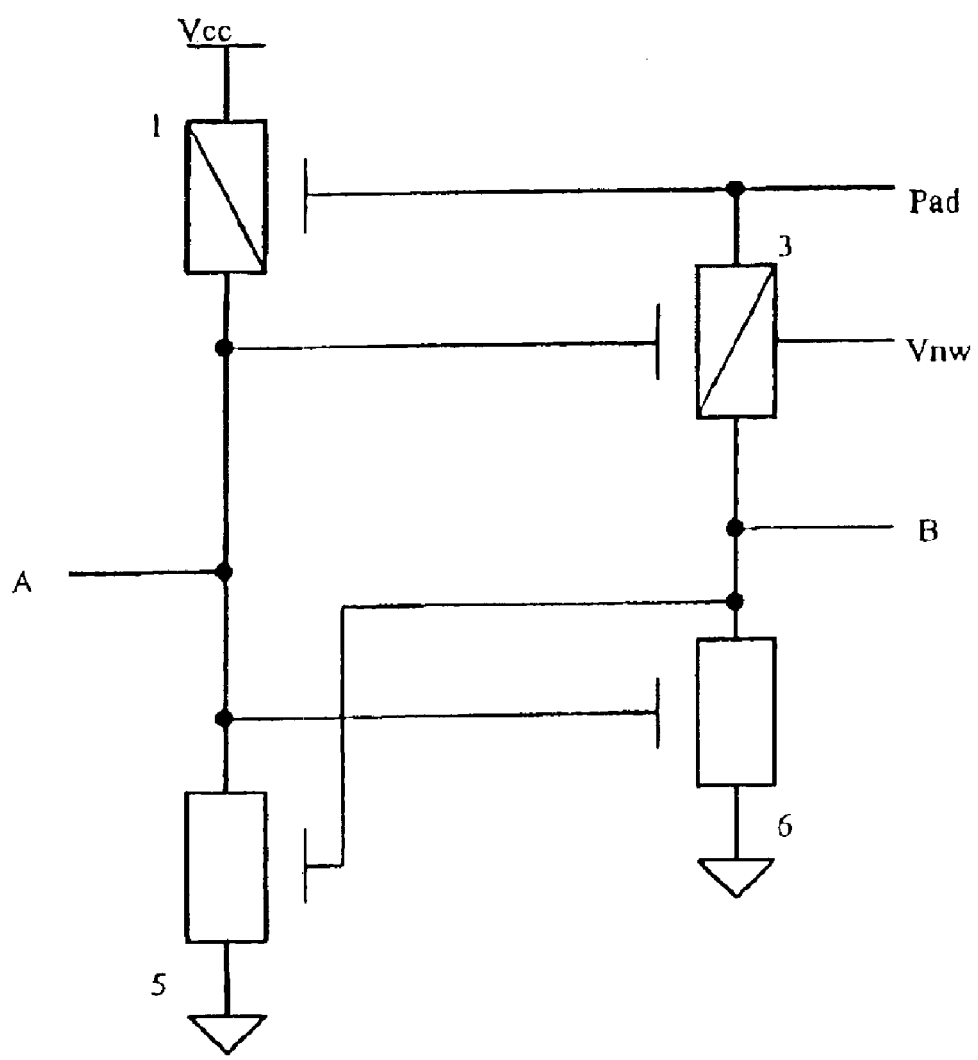
FIG. 3 is a circuit diagram showing the exemplary essential components of the overvoltage detection circuit shown in FIG. 1.

In an exemplary embodiment of the present invention, transistors 1, 3, 5, and 6 are the main components of the FIG. 1 circuit. These main components and their connections in the exemplary embodiment are shown in FIG. 3. However the main components are subject to many different implementations both in terms of type and number of switches used. Also, additional switches may be used to assist these switches. Transistor 1 conducts when the pad 23 voltage is substantially below Vcc–Vtp. Vtp is the threshold voltage of the transistor. Typically, Vtp is approximately 0.6 or 0.7 volts. However the value depends on the technology used to implement the transistor. By conducting, transistor 1 functions as a pull up device for node A. Transistor 2 also functions as a pull up device for node A by pulling it to Vcc 24. However, this device conducts and pulls node A to Vcc 24 when node B falls substantially below Vcc–Vtp. Transistor 2 ensures that node A stays near Vcc 24 if the pad 23 voltage remains between Vcc+Vtp and Vcc–Vtp, after it has been below this range. This transistor functions to stabilize the operation of the circuit by keeping node A at Vcc 24 until the pad 23 voltage exceeds Vcc+Vtp.

In the exemplary embodiment, transistors 3 and 4 function to pull node B to pad 23 voltage. Transistor 3 begins conducting when the pad 23 voltage exceeds the node A voltage by Vtp. By conducting, transistor 3 pulls node B to pad 23 voltage. As discussed previously, a logic level of 1 for node B indicates the overvoltage operation mode of the circuit. While in the overvoltage mode of operation, transistor 3 commutates the pad 23 voltage to node B. Transistor 4 assists the function of transistor 3. However, this transistor 4 does not commutate the pad 23 voltage to node B until the pad 23 voltage exceeds Vcc+Vtp. In the exemplary embodiment, transistor 4 aids the circuit (FIG. 1) in entering the overvoltage mode of operation.

In the exemplary embodiment, switches 5 and 6 comprise n-channel FET's. Transistor 5 functions when the node B voltage is more than Vtn greater than the negative supply, and serves as a pull down device for node A. Vtn is the threshold voltage of the transistor. Transistor 6 conducts when node A voltage is more than Vtn greater than the negative supply, and functions as a pull down device for node B. In some applications, it may be desirable to manually control the function of the overvoltage detector circuit (FIG. 1). As discussed previously, the circuit can operate in a "normal" mode or an "overvoltage" mode. In the exemplary embodiment, switches 7 and 8 comprise n-channel FET's that allow the circuit to be set to one of the two modes. When transistor 7 is enabled, the circuit may be quickly set to normal mode. When transistor 8 is enabled, the circuit may be quickly set to the overvoltage mode. These switching devices are optional and are not intended to limit the present invention.

The transistors of the exemplary embodiment may be biased in order to achieve optimal operation of the circuit (FIG. 1). In the exemplary embodiment, a biasing circuit is included. Switches 21 and 22 comprise the biasing circuit in the exemplary embodiment. In the exemplary embodiment, switches 21 and 22 comprise p-channel FET's. Together, transistors 21 and 22 create a voltage source for node Vnw that is biased at the greater of Vcc 24 and the voltage of the pad 23 connection. Biasing node Vnw to the greater of Vcc 24 and the pad 23 voltage allows the overvoltage circuit transistors 1–4 to operate with a low source to substrate voltage difference. The present invention, however, is not intended to be limited to any particular biasing circuit. Biasing circuits are well known to those skilled in the art and may be included or excluded in any particular implementation based on several factors, including, for example, the types of switches that are used in a given embodiment.

In an exemplary embodiment of the present invention, devices with low threshold voltages (Vt) may be employed. For example, p-channel devices may be replaced with low Vt p-channel devices. This makes the region of uncertainty about Vcc, the first voltage, smaller in respect to the nominal operating ranges of other devices in the system that use normal p-channel devices, and thus better protects them from potential damage due to, for example, stress from over-voltage operation. In the exemplary embodiment, not all devices need to be replaced with low Vt devices for the desired protection. The devices chosen for an implementation may be replaced can be chosen according to a particular application and technology by those skilled in the art. For example, replacing devices 3 and 4 (FIG. 1) with low Vt devices sets the circuit to the overvoltage mode at a lower differential between Vcc 24 and Pad 23 when Pad 23 exceeds the voltage of Vcc 24. This is just an example and is not intended to limit the present invention.

In many applications, circuits may be designed to conserve battery power. Any current (and therefore power) consumption that occurs when a circuit is not operating is called static current. Static current is drawn through a circuit when, for example, there is a direct path between a power source and the ground. The direct path causes current to constantly leak from the power source, even though the circuit is not performing a useful operation.

In addition to being able to detect overvoltage levels, the exemplary embodiment of the present invention uses substantially zero static DC current from the power supply or from the pad 23 of the system. The exemplary embodiment of the present invention is able to achieve substantially zero static DC current flow because the circuit (FIG. 1) has no path for DC current to flow. During the operation of the exemplary circuit, switching and node charging currents are drawn from the sources 23–24 during transition times. However, once the circuit is stable, substantially no static DC current is consumed, providing conflicting conditions are not sustained.

One unique form of overvoltage condition that the exemplary embodiment of the present invention is suited to is called "cold spare." A cold spare condition exists when the Vcc 24 power supply node is unconnected or its voltage is zero. Any positive voltage that is a magnitude of Vtp greater than either zero or the node A voltage applied to pad 23 is then recognized as an overvoltage condition. Under the cold spare condition, for example, devices 3, 4, 5, and 22 conduct, node A may have substantially zero voltage, and pad 23 voltage may be commutated to node B. Those skilled in the art will recognize that signal corruption and/or device damage similar to that arising from overvoltage mode operation is also possible during cold spare conditions. The control signals available from node A and from node B may be useful to one skilled in the art for the purposes of overcoming the negative aspects of cold spare operation.

Figure 4:
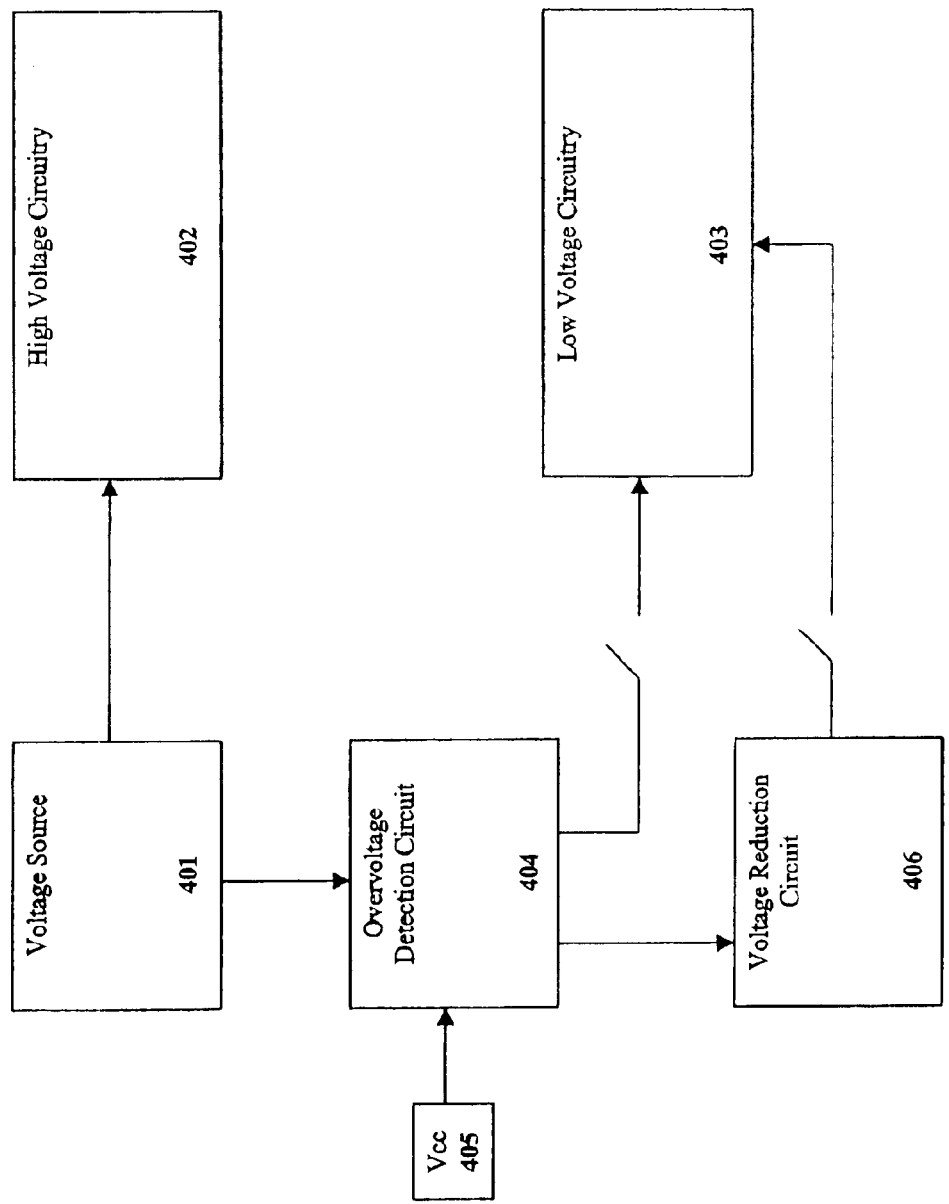
FIG. 4 is a block diagram of an exemplary system embodying the present invention.

The exemplary embodiment of the present invention can be applied to a variety of applications. FIG. 4 is a block diagram of an exemplary system embodying the present invention. In the exemplary system, a voltage source 401 supplies power to a plurality of circuitry. The circuitry in the exemplary system is divided into two categories. The first category is "high" voltage circuitry 402. The second category is "low" voltage circuitry 403. For example, the high voltage circuitry 402 may use an operating voltage of 5 volts while the low voltage circuitry 403 may use a voltage of 2.5 volts. This is just one example and is not intended to limit the present invention. The high and low voltages can have any magnitude of separation, depending on a particular application.

In the exemplary embodiment, the low voltage circuitry 403 determines if the voltage source 401 is providing a voltage that is low enough for the low voltage circuitry 403 to tolerate. If the magnitude of the voltage source 401 is too large, the low voltage circuitry 403 may be compromised. In order to determine if the low voltage circuitry 403 can tolerate voltage of the voltage source 401, the overvoltage detection circuit 404 is employed. The overvoltage detection circuit 404 receives a voltage from the voltage source 401 and a voltage representative of the operating voltage of the low voltage circuitry 403, Vcc 405. The operation of the overvoltage detection circuit is described with reference to FIG. 1. If the voltage from the voltage source 401 is determined to be compatible with the low voltage circuitry 403, the voltage 401 may be passed, for example, to the low voltage circuitry 403. If the magnitude of the voltage is determined to be too large, it may be passed through, for example, a voltage reducing circuit 406. The lowered voltage may then be used to power the low voltage circuitry 403.

The embodiment described with reference to FIG. 4 is just one example. A variety of circuits or systems, for example, voltage reduction circuits, may be designed to operate in conjunction with the present invention. For example, several high and low voltage circuits may be employed in a given circuit. The present invention is not meant to be limited to one high or low voltage circuit. Additionally, several voltage sources may be present in a given system. As will be appreciated by those skilled in the art, any circuitry can be placed after the overvoltage detection circuit 404.

Although the invention has been described with reference to particular embodiments, it will be understood to those skilled in the art that the invention is capable of a variety of alternative embodiments within the spirit of the appended claims.

What is claimed is:

1. A device for comparing an operating voltage with a supply voltage, comprising:
   a first transistor operatively connected to receive the operating voltage and the supply voltage;
   a second transistor operatively connected to said first transistor and to receive the supply voltage;
   a third transistor operatively connected to said first transistor, to said second transistor, and to ground; and
   a fourth transistor operatively connected to said first transistor, to said second transistor, to said third transistor, and to ground.

2. The device according to claim 1, further comprising a biasing circuit.

3. The device according to claim 2, wherein said biasing circuit comprises:
   a fifth transistor operatively connected to said second transistor, and to receive the operating voltage and the supply voltage; and
   a sixth transistor operatively connected to said second transistor, to said fifth transistor, and to receive the operating voltage and the supply voltage.

4. The device according to claim 3, further including:
   a seventh transistor operatively connected to said first transistor, to said third transistor, to said fourth transistor, and to receive the operating voltage; and
   an eighth transistor operatively connected to said first transistor, to said second transistor, to said third transistor, to said fourth transistor, and to receive the operating voltage and the supply voltage.

5. The device according to claim 4, wherein said operatively connected transistors use substantially zero static current.

6. The device according to claim 5, wherein said transistors comprise at least one of n-channel or p-channel field effect transistors.

7. The device according to claim 6, wherein said transistors have a substantially low threshold voltage.

8. A device for comparing an operating voltage with a supply voltage, comprising:
- a first transistor operatively connected to pass the operating voltage responsive to the supply voltage;
- a second transistor operatively connected to said first transistor, and to pass the operating voltage responsive to the supply voltage;
- a third transistor operatively connected to said first transistor, to said second transistor, and to pass the supply voltage responsive to the operating voltage; and
- a fourth transistor operatively connected to said first transistor, to said second transistor, to said third transistor, and to pass the supply voltage responsive to the operating voltage.

9. The device according to claim 8, further comprising a biasing circuit.

10. The device according to claim 9, wherein said biasing circuit comprises:
- a fifth transistor operatively connected to said second transistor and to receive the operating voltage and the supply voltage; and
- a sixth transistor operatively connected to said second transistor, to said fifth transistor and to receive the operating voltage and the supply voltage.

11. The device according to claim 10, further including:
- a seventh transistor operatively connected to said first transistor, to said third transistor, and to said fourth transistor, to receive the operating voltage, and to pass the operating voltage responsive to the supply voltage; and
- an eighth transistor operatively connected to said first transistor, to said second transistor, to said third transistor, to said fourth transistor, to receive the operating voltage and the supply voltage, and to pass the supply voltage responsive to said operating voltage.

12. The device according to claim 11, wherein said transistors comprise at least one of n-channel or p-channel field effect transistors.

13. The device according to claim 12, wherein said transistors consume substantially zero static current.

14. The device according to claim 13, wherein said transistors have a substantially low threshold voltage.

* * * * *